(12) United States Patent
Gotou et al.

(10) Patent No.: US 7,777,571 B2
(45) Date of Patent: Aug. 17, 2010

(54) HIGH FREQUENCY POWER AMPLIFIER

(75) Inventors: Seiki Gotou, Tokyo (JP); Akira Inoue, Tokyo (JP); Ko Kanaya, Tokyo (JP); Shinsuke Watanabe, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 12/147,542

(22) Filed: Jun. 27, 2008

(65) Prior Publication Data
US 2009/0237166 A1    Sep. 24, 2009

(30) Foreign Application Priority Data
Mar. 21, 2008    (JP) .............. 2008-073931

(51) Int. Cl.
*H03F 3/191* (2006.01)

(52) U.S. Cl. ............ 330/295; 330/302; 330/286

(58) Field of Classification Search ............ 330/295, 330/302, 307, 53, 124 R, 286, 84
See application file for complete search history.

(56) References Cited

U.S. PATENT DOCUMENTS

| | | | |
|---|---|---|---|
| 5,347,229 A | | 9/1994 | Suckling et al. |
| 6,671,505 B1 * | | 12/2003 | Koizumi .............. 455/333 |
| 6,759,908 B2 | | 7/2004 | Gotou et al. |
| 7,286,018 B2 * | | 10/2007 | Makihara et al. .......... 330/295 |
| 7,310,019 B2 * | | 12/2007 | Gotou et al. .............. 330/295 |
| 2008/0315392 A1 * | | 12/2008 | Farrell et al. ............. 257/691 |

FOREIGN PATENT DOCUMENTS

| | | | |
|---|---|---|---|
| JP | 2002-164753 A | | 6/2002 |
| JP | 2007-60616 A | | 3/2007 |

* cited by examiner

*Primary Examiner*—Robert Pascal
*Assistant Examiner*—Hieu P Nguyen
(74) *Attorney, Agent, or Firm*—Leydig, Voit & Mayer, Ltd.

(57) ABSTRACT

A high frequency power amplifier comprises: a multi-finger transistor with transistor cells electrically connected in parallel; an input side matching circuit connected to gate electrodes of the transistor cells; and resonant circuits respectively connected between the gate electrode of a transistor cell and the input side matching circuit. The resonant circuit resonates at a second harmonic of the operating frequency of the transistor or within a predetermined range of frequencies having a center at the second harmonic of the operating frequency, and becomes a high-impedance load at the second harmonic, or an open load.

17 Claims, 13 Drawing Sheets

REFERENCE ART

REFERENCE ART

HIGH FREQUENCY POWER AMPLIFIER

BACKGROUND OF THE INVENTION

1. Field of the Invention

The present invention relates to a high frequency power amplifier used in microwave and millimeter wave band communication devices for mobile communications, satellite communications and the like.

2. Background Art

In microwave communication systems using multicarrier signals or modulated wave signals, such as recently developed CDMA system, the effect of distortion generated by the non-linearity of a high frequency power amplifier must be minimized. On the other hand, it has been known that if a resonant circuit, which becomes an open load or high-impedance load to the secondary harmonic, is located at the input side, the efficiency of a high frequency power amplifier can be improved (for example, refer to Japanese Patent Application Laid-Open No. 2002-164753). In a high-output power amplifier for mobile communications and satellite communications, to obtain large power output, a multi-finger transistor, with a plurality of transistor cells electrically connected in parallel to enlarge gate width, is employed.

FIGS. 19 and 20 are circuit diagrams showing reference examples of high frequency power amplifiers having resonant circuits located at input sides. Transistor cells 11 are electrically connected in parallel, an input-side matching circuit 13 is connected to the gate electrodes of the transistor cells via adjusting lines 16 and bonding wires 12, and an output-side matching circuit 15 is connected to the drain electrodes of the transistor cells via bonding wires 14. In the circuits shown in FIGS. 19 and 20, resonant circuits 17 are located before the input-side matching circuit 13. The resonant circuit 17 shown in FIG. 19 is an open load to the second harmonic; and the resonant circuits 17 shown in FIG. 20 are high-impedance loads to the second harmonic.

In the circuit shown in FIG. 19, since the resonant circuit 17 is connected after gate electrodes have been collectively connected to the input-side matching circuit 13, phase differences occur between the cells when the input-side matching circuit 13 is viewed from the gate electrode of each transistor cell 11. Therefore, the second harmonic load, viewed from the gate electrode of each transistor cell 11, cannot be an identical high-impedance load for each transistor cell. When a multi-finger transistor is used, the input impedance of the transistor is inevitably significantly lowered. For this reason, in the circuit shown in FIG. 20, since propagation loss attenuates reflected waves from the resonant circuit 17, the second harmonic load cannot be controlled as an open load. Therefore, the circuits shown in FIGS. 19 and 20 have a problem of poor distortion characteristics.

SUMMARY OF THE INVENTION

To solve the above-described problem, it is an object of the present invention to provide a high frequency power amplifier that can improve distortion characteristics.

According to one aspect of the present invention, a high frequency power amplifier comprises: a multi-finger type transistor with a plurality of transistor cells electrically connected in parallel; an input side matching circuit connected to gate electrodes of said plurality of transistor cells; and a resonant circuit respectively connected between the gate electrode of each transistor cell and said input side matching circuit, wherein said resonant circuit is resonated with a frequency of secondary harmonics of an operating frequency of said transistor or within a predetermined range of frequency having the center at the secondary harmonics of the operating frequency, and becomes a high-impedance load to the secondary harmonics, or an open load.

According to the present invention, the strain characteristics can be improved.

Other and further objects, features and advantages of the invention will appear more fully from the following description.

DETAILED DESCRIPTION OF THE PREFERRED EMBODIMENTS

First Embodiment

Figure 1:
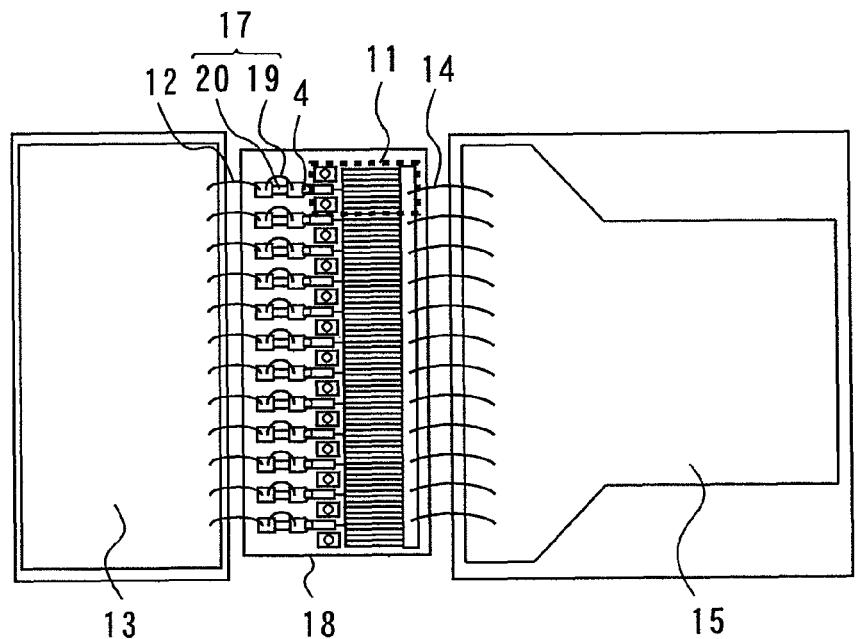
FIG. 1 is a top view showing a high frequency power amplifier according to the first embodiment of the present invention.
Figure 2:
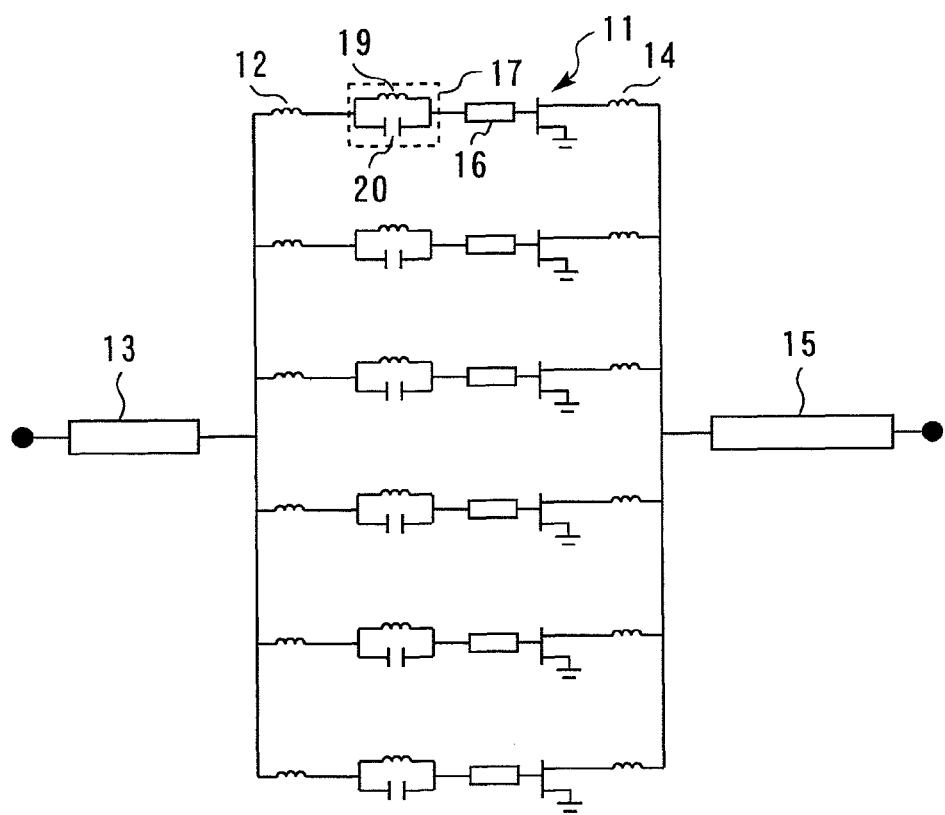
FIG. 2 is a circuit diagram showing a high frequency power amplifier according to the first embodiment of the present invention.

FIG. 1 is a top view showing a high frequency power amplifier according to the first embodiment of the present invention; and FIG. 2 is a circuit diagram thereof.

By electrically connecting a plurality of transistor cells 11 in parallel, a multi-finger type transistor is formed. The gate electrodes of the plurality of transistor cells 11 are connected to an input-side matching circuit 13 via bonding wires 12. The drain electrodes of the plurality of transistor cells 11 are connected to an output-side matching circuit 15 via bonding wires 14. The source electrodes of the plurality of transistor cells 11 are grounded. The bonding wires 12 and 14 function as inductors.

An adjusting line 16 and a resonant circuit 17 are connected between the gate electrode and the input-side matching circuit 13 of each transistor cell 11. Specifically, after a resonant circuit 17 has been connected to the gate electrode of each transistor cell 11, the resonant circuit 17 is connected to the input-side matching circuit 13 using the bonding wire 12.

The resonant circuits 17 are formed on the same chip 18 as the transistors, and each has a bonding wire 19 and an MIM capacitor 20 connected to each other in parallel. The bonding wires 19 function as inductors. The resonant circuits 17 are resonated with a frequency of secondary harmonics of the operating frequency of the transistor, or within a predetermined range of frequency having the center at the secondary harmonics of the operating frequency to give high-impedance load to the secondary harmonics. Thereby, since the secondary harmonic load viewed from the gate electrode of each transistor cell 11 can be equally high-impedance load, the strain characteristics can be improved.

Second Embodiment

Figure 3:
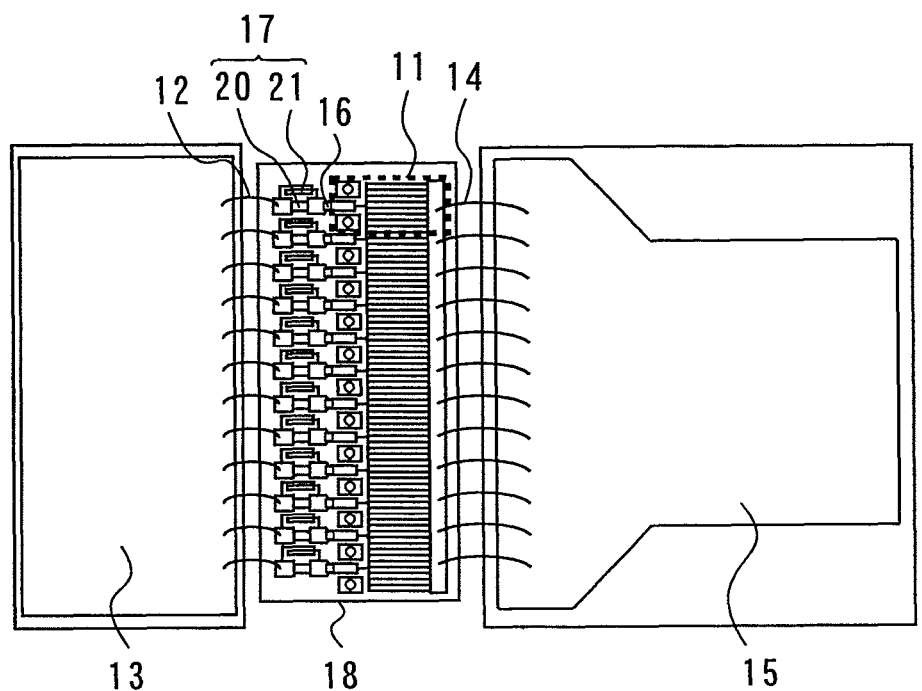
FIG. 3 is a top view showing a high frequency power amplifier according to the second embodiment of the present invention.

FIG. 3 is a top view showing a high frequency power amplifier according to the second embodiment of the present invention. The circuit diagram is the same as the circuit diagram of the first embodiment.

Different from the first embodiment, spiral inductors 21 formed on the same chip 18 as the transistors are used as inductors for resonant circuits 17 in place of bonding wires 19. Other configurations are identical to the configurations of the first embodiment.

In the first embodiment, when the operating frequency is high, the resonant frequencies of the resonant circuits 17 are significantly fluctuated by the variation of inductance due to the fluctuation of the lengths of bonding wires 19. While in the present embodiment, the fluctuation of the inductance of the spiral inductors 21 can be suppressed, and the variation of the resonant frequencies of the resonant circuits 17 can be suppressed.

Third Embodiment

Figure 4:
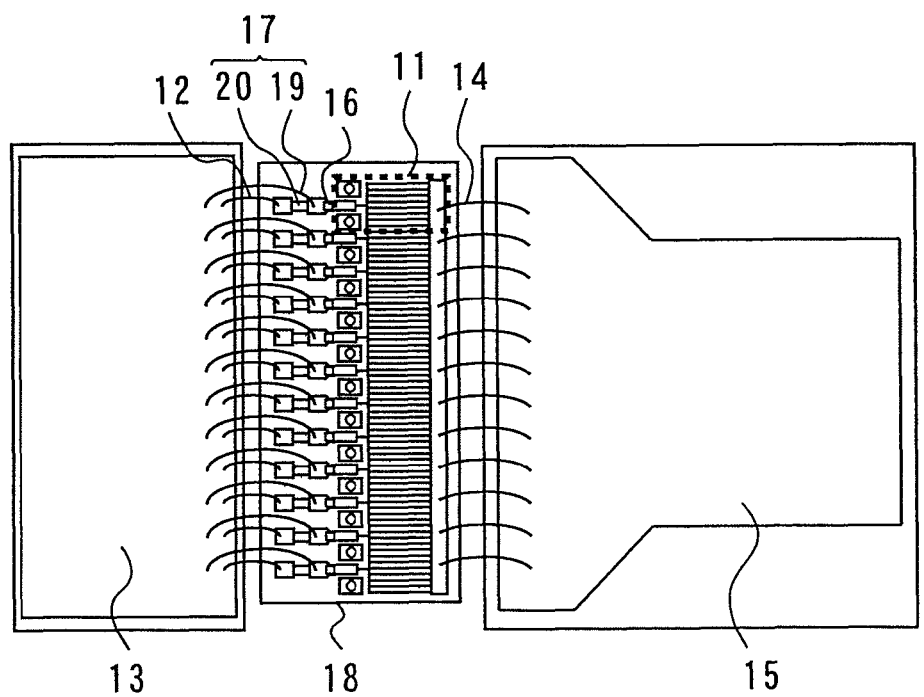
FIG. 4 is a top view showing a high frequency power amplifier according to the third embodiment of the present invention.
Figure 5:
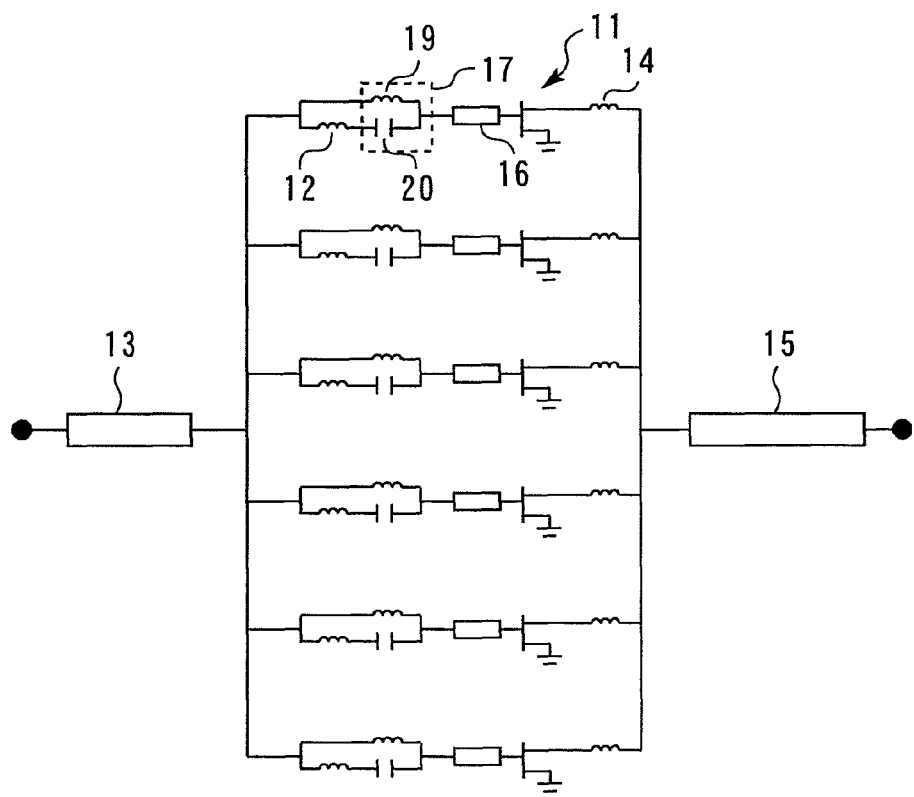
FIG. 5 is a circuit diagram showing a high frequency power amplifier according to the third embodiment of the present invention.

FIG. 4 is a top view showing a high frequency power amplifier according to the third embodiment of the present invention; and FIG. 5 is a circuit diagram thereof. An end of each bonding wire 19 is connected to an input-side matching circuit 13. Other configurations are identical to the configurations of the first embodiment. Thereby, since the bonding wires 19 can be elongated, the present embodiment is effective when high inductance is required.

Fourth Embodiment

Figure 6:
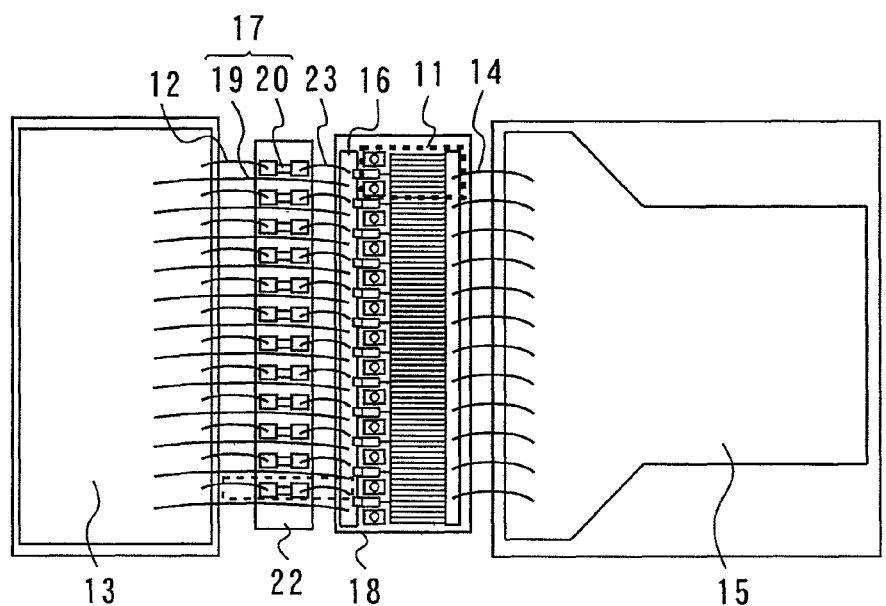
FIG. 6 is a top view showing a high frequency power amplifier according to the fourth embodiment of the present invention.
Figure 7:
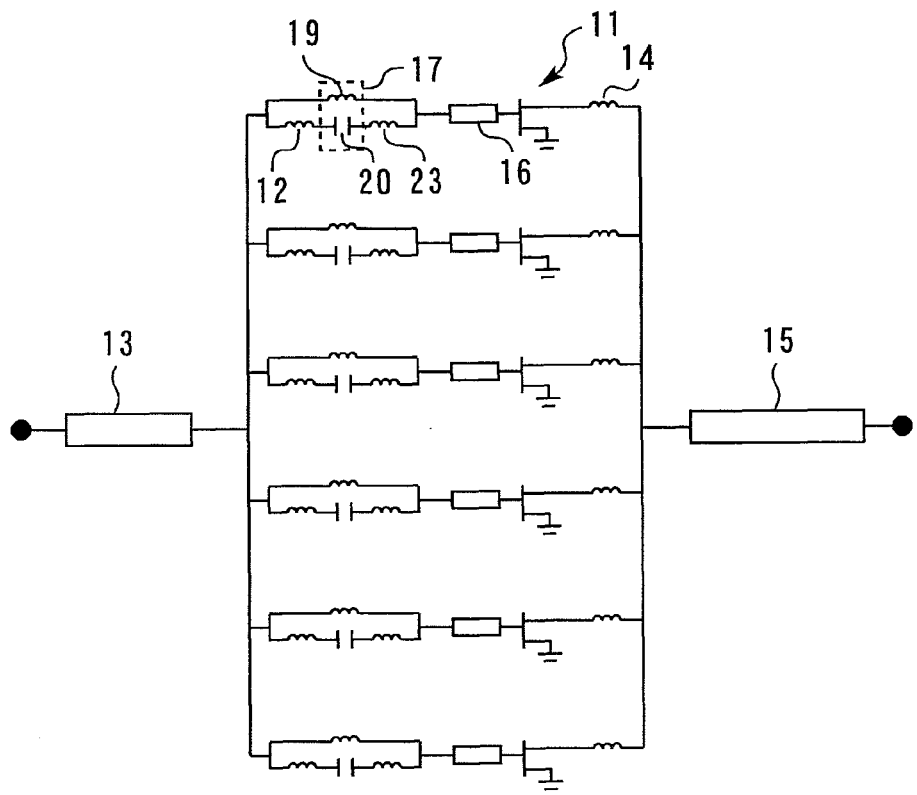
FIG. 7 is a circuit diagram showing a high frequency power amplifier according to the fourth embodiment of the present invention.

FIG. 6 is a top view showing a high frequency power amplifier according to the fourth embodiment of the present invention; and FIG. 7 is a circuit diagram thereof. MIM capacitors 20 are formed on a chip 22 separated from the chip on which transistors are formed. An end of each MIM capacitor 20 is connected to an input-side matching circuit 13 via a bonding wire 12, and the other end of each MIM capacitor 20 is connected to an adjusting line 16 via a bonding wire 23. Other configurations are identical to the configurations of the first embodiment. Thereby, when the costs of the chip 18 on which transistors are formed are high, MIM capacitors can be formed on a separate inexpensive chip 22 to lower the costs.

Fifth Embodiment

Figure 8:
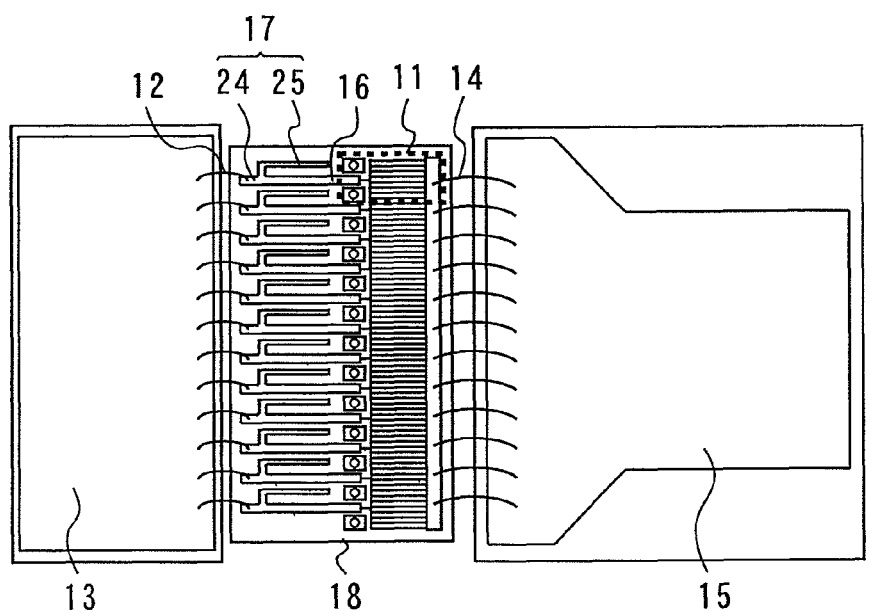
FIG. 8 is a top view showing a high frequency power amplifier according to the fifth embodiment of the present invention.
Figure 9:
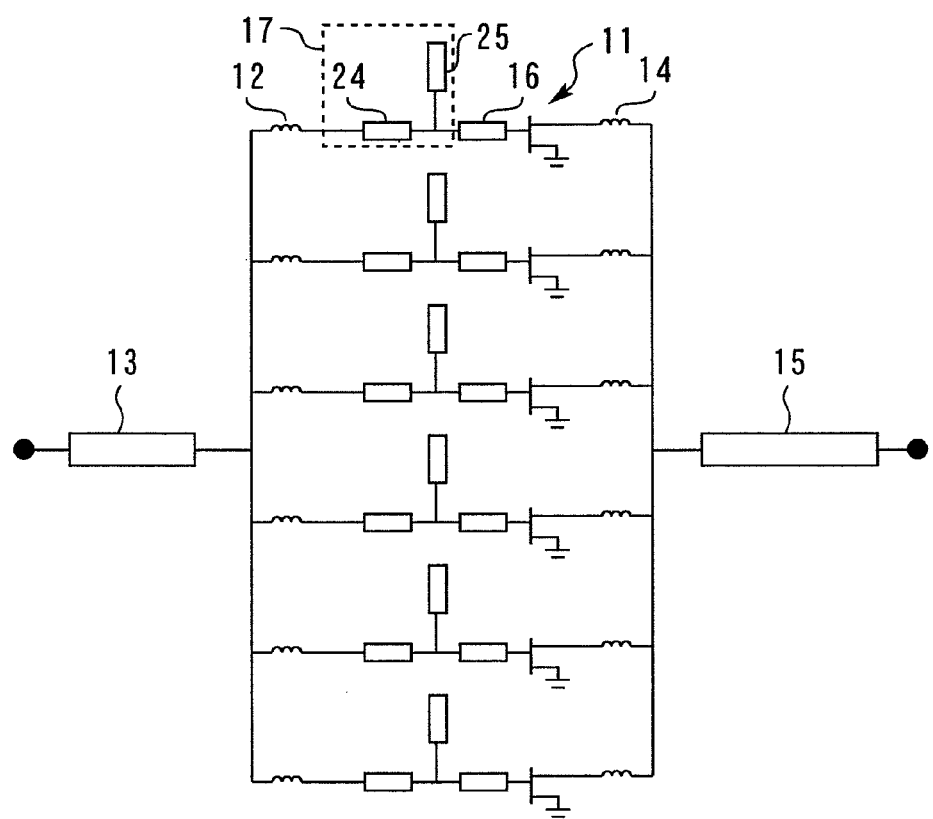
FIG. 9 is a circuit diagram showing a high frequency power amplifier according to the fifth embodiment of the present invention.

FIG. 8 is a top view showing a high frequency power amplifier according to the fifth embodiment of the present invention; and FIG. 9 is a circuit diagram thereof. The fifth embodiment is the same as the first embodiment except for the internal configuration of the resonant circuit 17.

The resonant circuit 17 has an electrical length controlling line 24 and an open-end stub 25. An end of the open-end stub 25 is connected to the electrical length controlling line 24, and the other end of the open-end stub 25 is free. The electrical length controlling line 24 is connected to an input-side matching circuit 13 via a bonding wire 12.

By controlling the lengths of the open-end stub 25 and the electrical length controlling line 24, the secondary harmonic load viewed from the gate electrode of each transistor cell 11 can be controlled to have a desired value. For example, when the length of the open-end stub 25 and the length of the electrical length controlling line 24 are $\lambda/8$ relative to the wavelength $\lambda$ of the operating frequency signal, the resonant circuit 17 becomes an open load to the secondary harmonic, and the strain characteristics can be improved.

Sixth Embodiment

Figure 10:
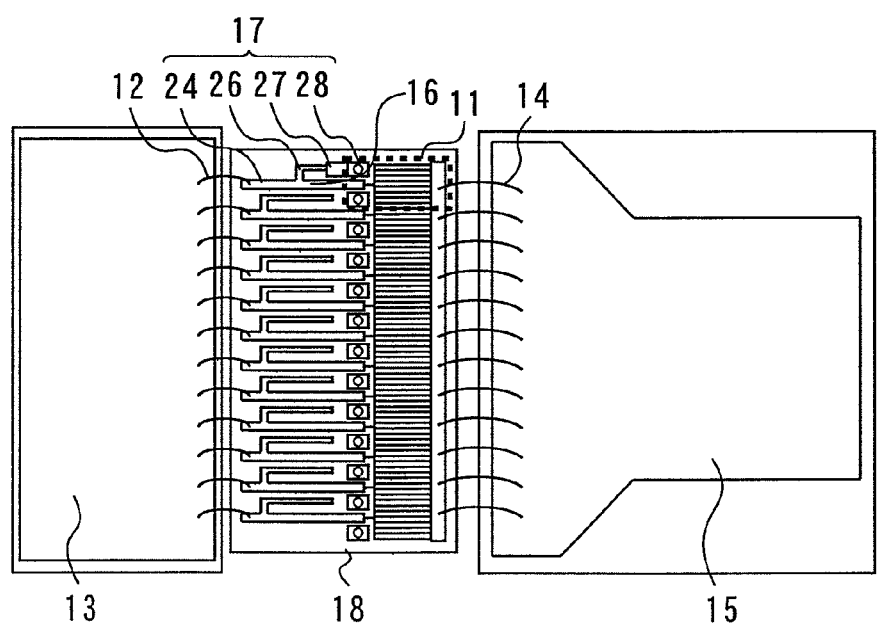
FIG. 10 is a top view showing a high frequency power amplifier according to the sixth embodiment of the present invention.
Figure 11:
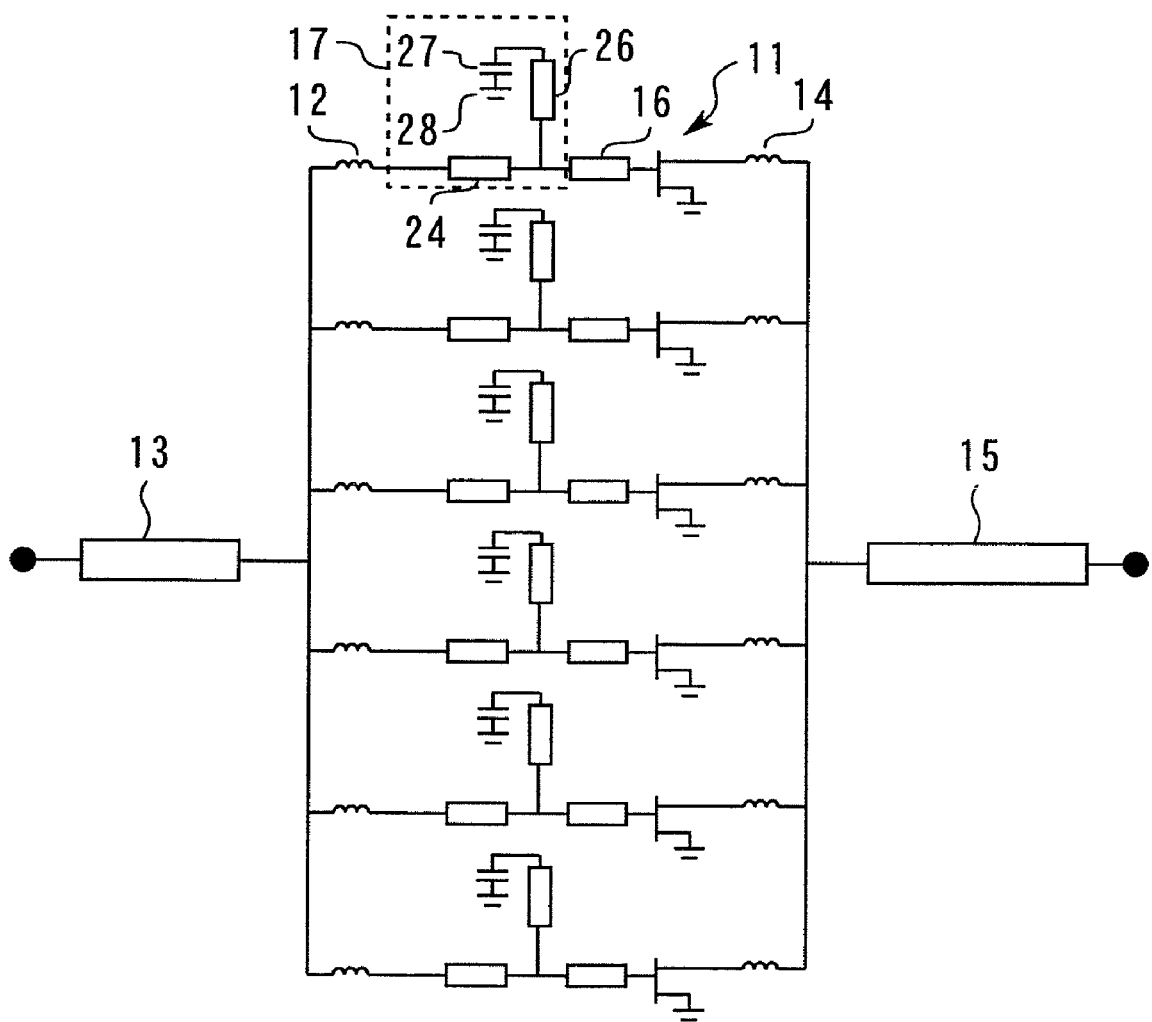
FIG. 11 is a circuit diagram showing a high frequency power amplifier according to the sixth embodiment of the present invention.

FIG. 10 is a top view showing a high frequency power amplifier according to the sixth embodiment of the present invention; and FIG. 11 is a circuit diagram thereof. The sixth embodiment is the same as the first embodiment except for the internal configuration of the resonant circuit 17.

The resonant circuit 17 has an electrical length controlling line 24 and a short-circuited-end stub 26. An end of the short-circuited-end stub 26 is connected to the electrical length controlling line 24, and the other end of the short-circuited-end stub 26 is connected to a via hole 28 connected to a back face ground via a capacitor 27, and short-circuited. The electrical length controlling line 24 is connected to an input-side matching circuit 13 via a bonding wire 12.

By controlling the lengths of the short-circuited-end stub 26 and the electrical length controlling line 24, the secondary harmonic load viewed from the gate electrode of each transistor cell 11 can be controlled to have a desired value. For example, when the length of the short-circuited-end stub 26 is $\lambda/4$ and the length of the electrical length controlling line 24 is $\lambda/8$ relative to the wavelength $\lambda$ of the operating frequency signal, the resonant circuit 17 becomes an open load to the secondary harmonic, and the strain characteristics can be improved.

Seventh Embodiment

Figure 12:
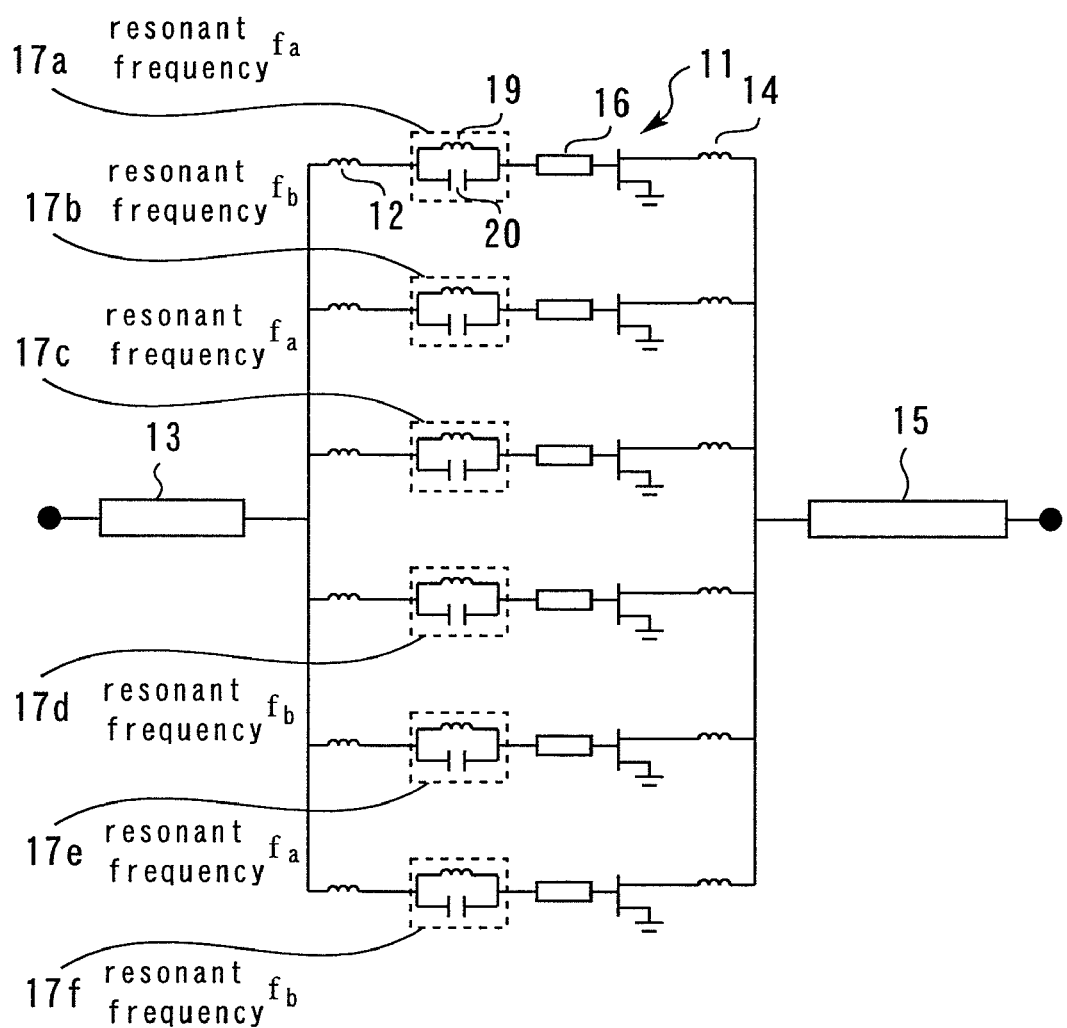
FIG. 12 is a circuit diagram showing a high frequency power amplifier according to the seventh embodiment of the present invention.

FIG. 12 is a circuit diagram showing a high frequency power amplifier according to the seventh embodiment of the present invention. The resonant frequency of resonant circuits 17a to 17f is divided to at least two different frequencies by changing inductance or capacitance. Here, the resonant frequency of resonant circuits 17a, 17c, and 17e is $f_a$; and the resonant frequency of resonant circuits 17b, 17d, and 17f is $f_b$. Other configurations are the same as the configurations of the first embodiment.

Figure 13:
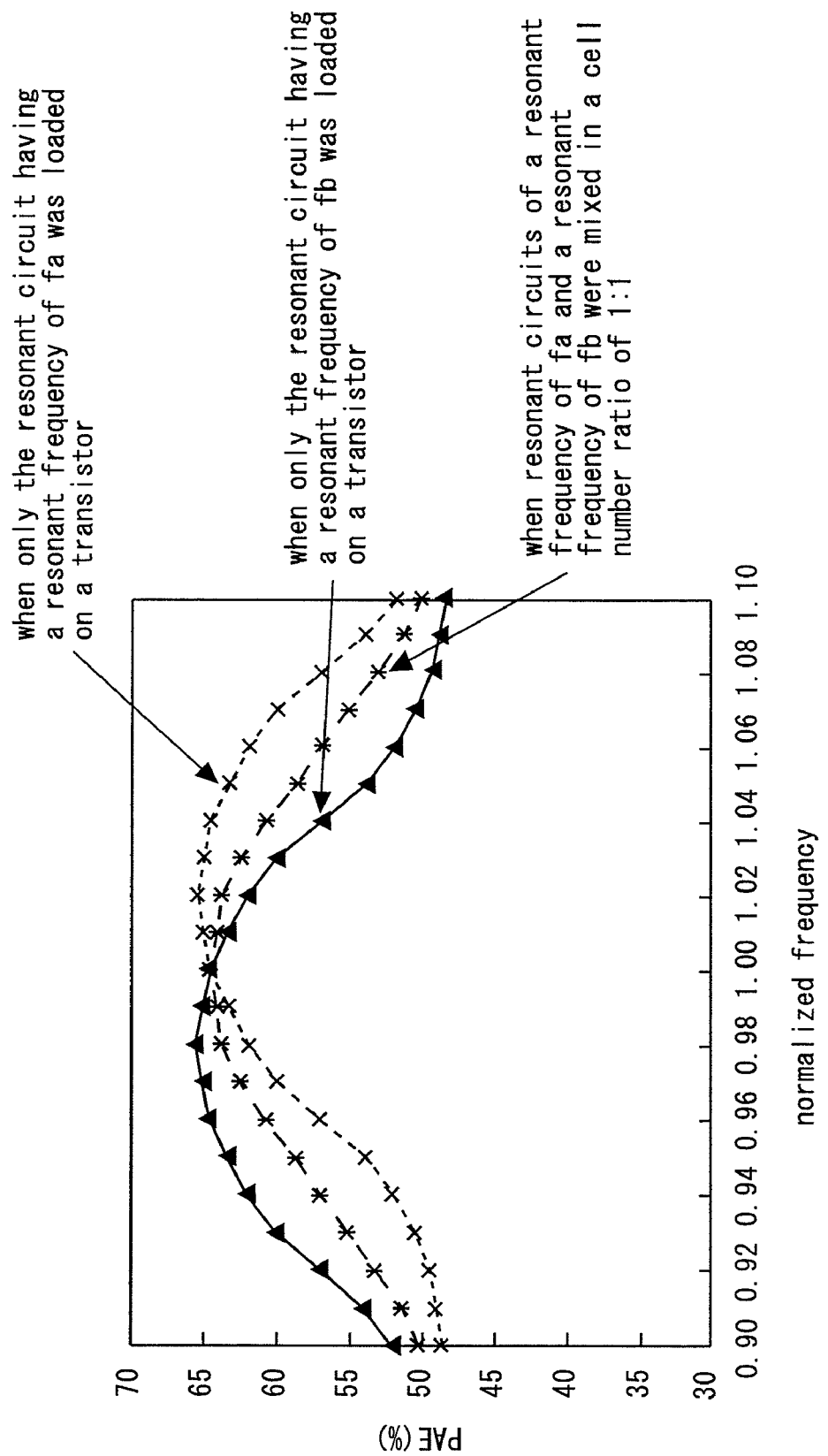
FIG. 13 is a graph showing change in PAE relative to a normalized frequency.

FIG. 13 is a graph showing change in PAE relative to a normalized frequency. The normalized frequency means a normalized operating frequency, and PAE means power added efficiency. The operating frequency band is a range of normalized frequencies between 0.9 and 1.1. Calculations were performed for three cases: when only the resonant circuit having a resonant frequency of $f_a$ was loaded on a transistor; when only the resonant circuit having a resonant frequency of $f_b$ was loaded on a transistor; and when resonant circuits of a resonant frequency of $f_a$ and a resonant frequency of $f_b$ were mixed in a cell number ratio of 1:1 (circuit shown in FIG. 12).

Assuming that only the resonant frequencies of resonant circuits 17a to 17f affect PAE, when resonant circuits of resonant frequencies of $f_a$ and $f_b$ are mixed, PAE takes an intermediate value in comparison with the case when a resonant circuit having only resonant frequency of $f_a$ or $f_b$ is used. Therefore, if the two resonant frequencies are appropriately selected, the strain characteristics can be improved in a wider band.

The number of resonant frequencies in each resonant circuit 17 is preferably an aliquot of the number of a plurality of transistor cells 11. Thereby, a uniform operation of the entire transistor can be realized.

Figure 14:
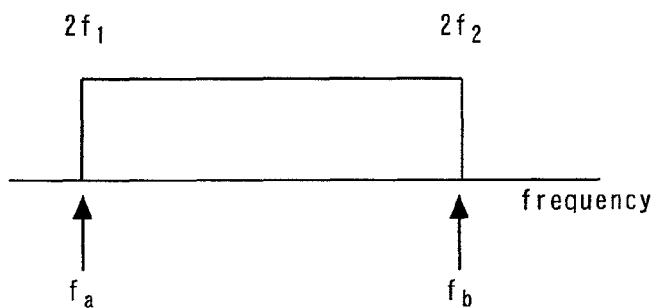
FIGS. 14 to 16 are graphs showing examples of resonant frequency setting.
Figure 15:
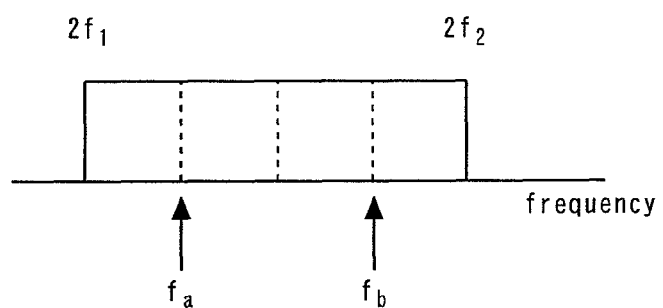
Figure 16:
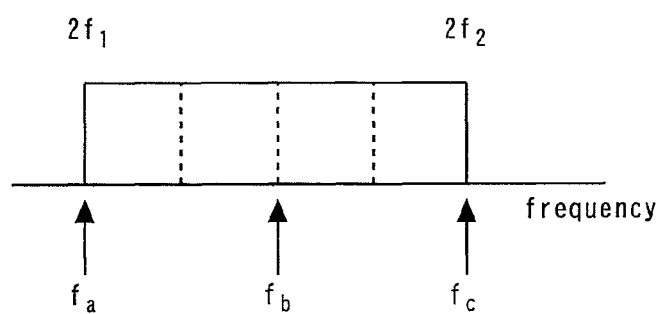

FIGS. 14 to 16 are graphs showing examples of resonant frequency setting. Here, the lower limit and the upper limit of the operation frequencies of a transistor are represented by $f_1$ and $f_2$, respectively. In FIG. 14, resonant frequencies $f_a$ and $f_b$ are set to a frequency in the vicinity of the lower limit $2f_1$ of the secondary harmonic and the upper limit $2f_2$ of the secondary harmonic, respectively. In FIG. 15, resonant frequencies $f_a$ and $f_b$ are set to a frequency in the vicinity of $(3f_1+f_2)/2$ and a frequency in the vicinity of $(f_1+3f_2)/2$, respectively. In FIG. 16, resonant frequencies $f_a$, $f_b$ and $f_c$ are set to a frequency in the vicinity of $2f_1$, a frequency in the vicinity of $f_1+f_2$, and a frequency in the vicinity of $2f_2$, respectively. Taking the Q value of the resonant circuit into consideration, a combination from which more planar strain characteristics is obtained can be selected.

Eighth Embodiment

Figure 17:
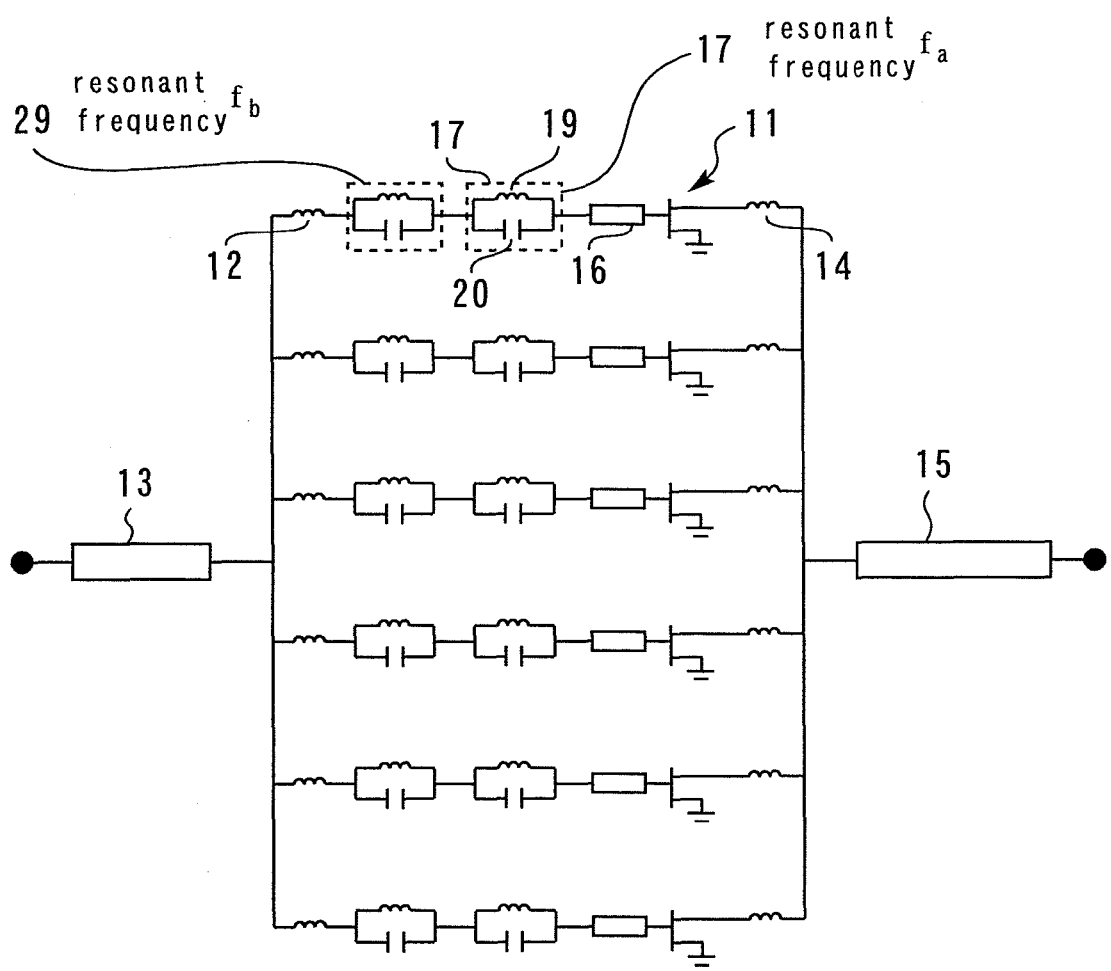
FIG. 17 is a circuit diagram showing a high frequency power amplifier according to the eighth embodiment of the present invention.

FIG. 17 is a circuit diagram showing a high frequency power amplifier according to the eighth embodiment of the present invention. To each resonant circuit 17, a second resonant circuit 29 having a resonant frequency $f_b$ different from the resonant frequency $f_a$ of the resonant circuit 17 is connected in series. Other configurations are the same as the configurations of the first embodiment. Thereby, the strain characteristics can be improved in terms of cells over a wide band.

For example, the second resonant circuit 29 may be resonated with a frequency of tertiary or higher harmonics of operating frequency of the transistor or within a predetermined range of frequency having the center at the tertiary or higher harmonics of the operating frequency to give a high-impedance load or an open load to the tertiary or higher harmonics.

Ninth Embodiment

Figure 18:
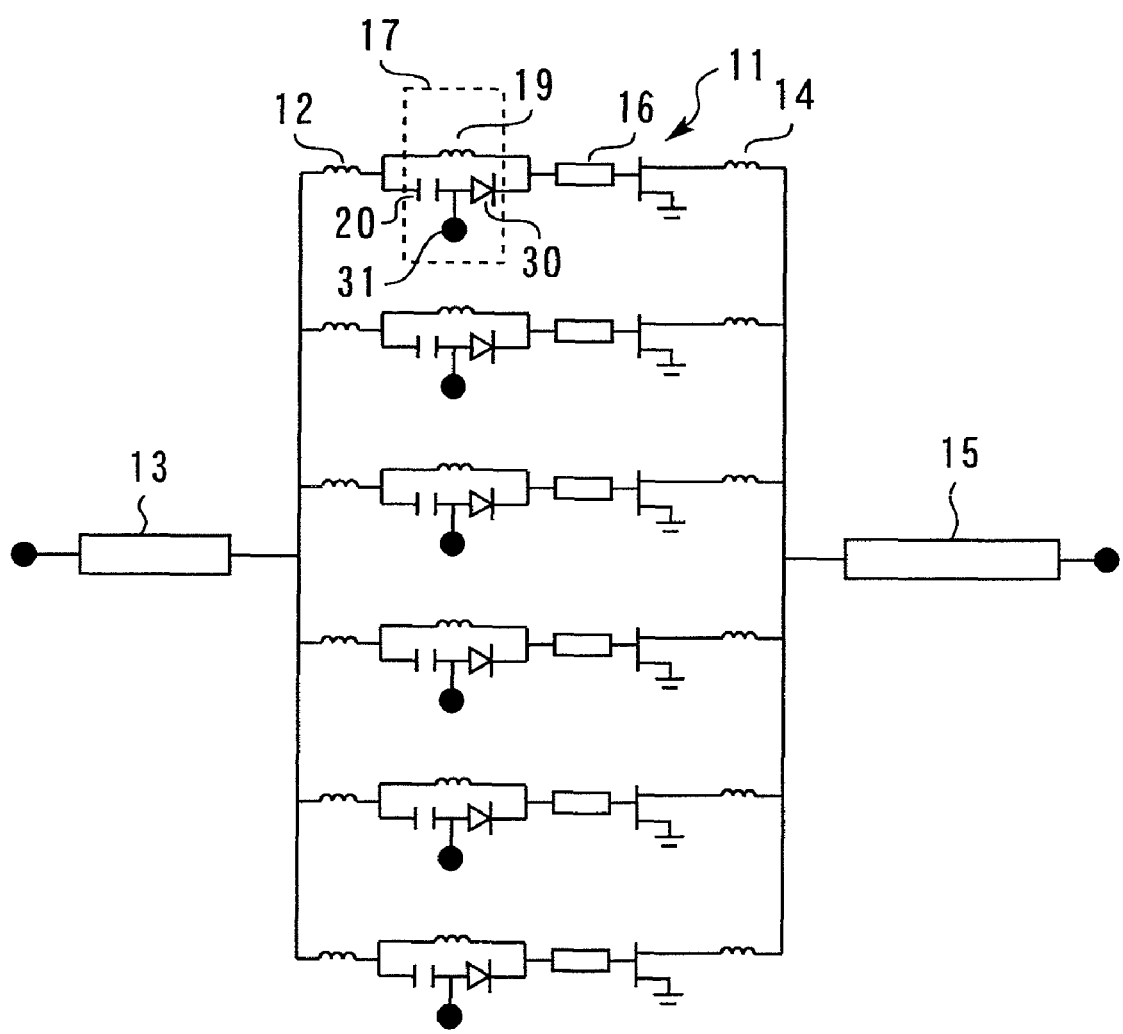
FIG. 18 is a circuit diagram showing a high frequency power amplifier according to the ninth embodiment of the present invention.
Figure 19:
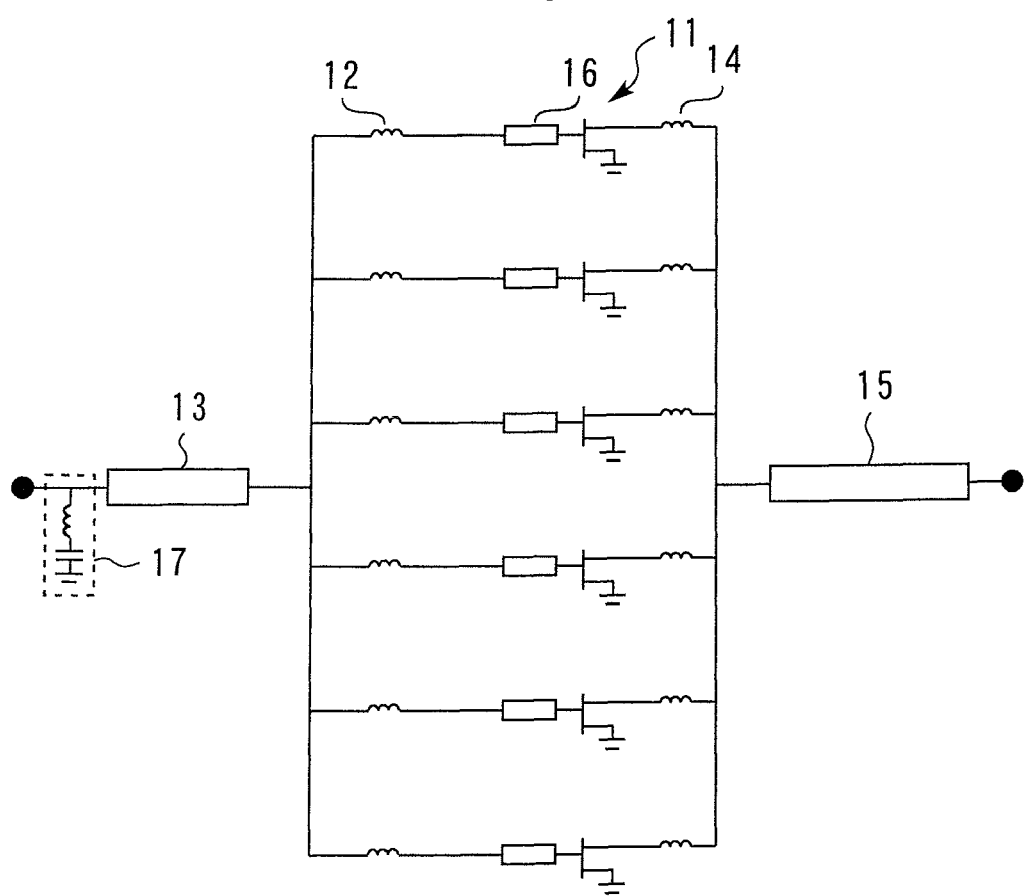
FIGS. 19 and 20 are circuit diagrams showing reference examples of high frequency power amplifiers having resonant circuits formed in input sides.
Figure 20:
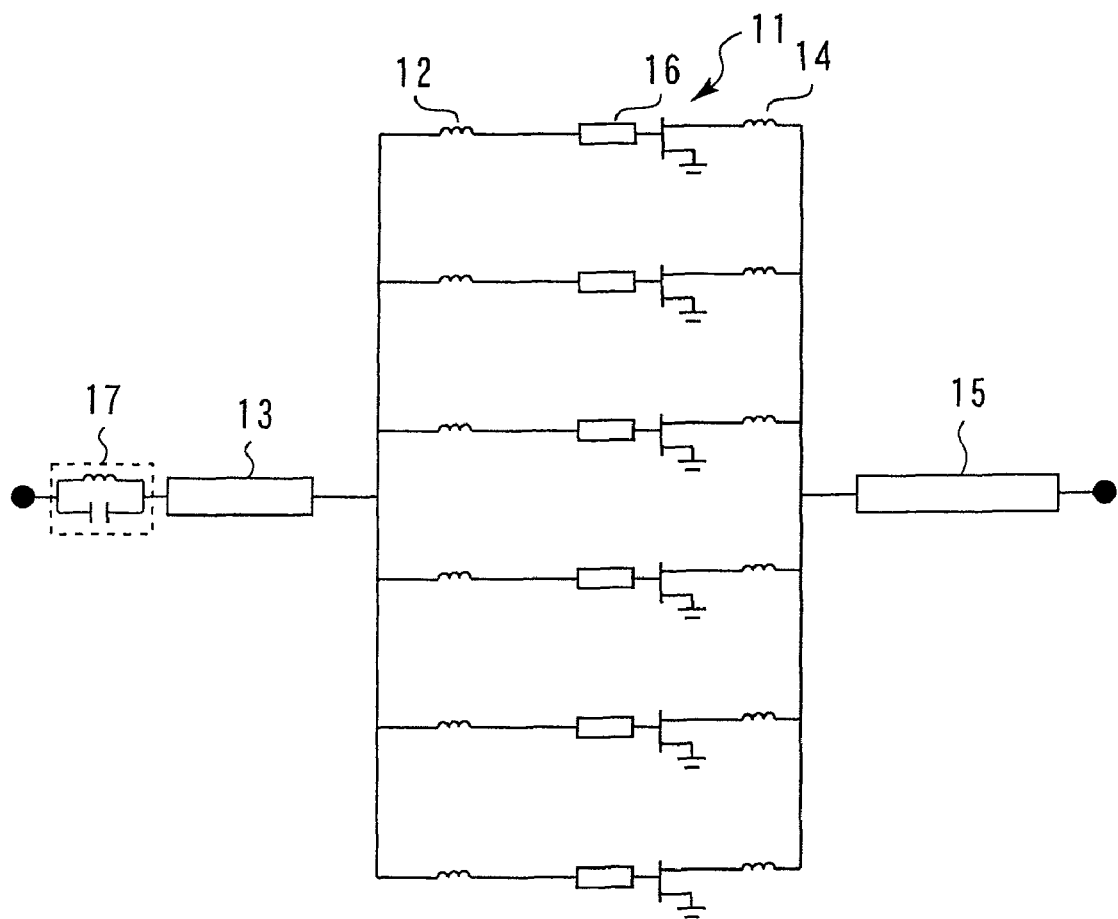

FIG. 18 is a circuit diagram showing a high frequency power amplifier according to the ninth embodiment of the present invention. The ninth embodiment is the same as the first embodiment except for the internal configuration of the resonant circuit 17.

The resonant circuit 17 has a diode 30 and a DC supply terminal 31 in addition to a bonding wire 19 and an MIM capacitor 20. The diode 30 is connected in parallel to the bonding wire 19 and connected in series to the MIM capacitor 20. The DC supply terminal 31 is connected to the joining point of the diode 30 and the MIM capacitor 20. By applying a DC bias to the DC supply terminal 31 from the exterior, the capacitance of the capacitor in the resonant circuit 17 can be controlled from the exterior, and the resonant frequency can be controlled. Also by adjusting the length of the bonding wire 19 to vary the inductance, the resonant frequency can be controlled. Thereby, since the resonant frequency after fabricating elements can be controlled, it is more advantageous than fabricating capacitors or inductors using circuit elements or patterns.

Obviously many modifications and variations of the present invention are possible in the light of the above teachings. It is therefore to be understood that within the scope of the appended claims the invention may be practiced otherwise than as specifically described.

The entire disclosure of a Japanese Patent Application No. 2008-073931, filed on Mar. 21, 2008 including specification, claims, drawings and summary, on which the Convention priority of the present application is based, are incorporated herein by reference in its entirety.

What is claimed is:

1. A high frequency power amplifier comprising:
   a multi-finger transistor with a plurality of transistor cells electrically connected in parallel;
   an input side matching circuit connected to gate electrodes of said plurality of transistor cells; and
   a plurality of resonant circuits, a respective resonant circuit being connected between the gate electrode of each transistor cell and said input side matching circuit, wherein said resonant circuits resonate at a second harmonic of an operating frequency of said transistor or within a predetermined range of frequencies having a center at the second harmonic of the operating frequency, and become a high-impedance load or an open load at the second harmonic, and
   each of said resonant circuits includes an inductor and a capacitor connected in parallel.

2. The high frequency power amplifier according to claim 1, wherein the inductors and the capacitors of each of said resonant circuits are located on the same chip as said transistor.

3. A high frequency power amplifier comprising:
   a multi-finger transistor with a plurality of transistor cells electrically connected in parallel;
   an input side matching circuit connected to gate electrodes of said plurality of transistor cells; and
   a plurality of first resonant circuits, a respective first resonant circuit being connected between the gate electrode of each transistor cell and said input side matching circuit, wherein said first resonant circuits resonate at a second harmonic of an operating frequency of said transistor or within a predetermined range of frequencies having a center at the second harmonic of the operating frequency, and becomes a high-impedance load or an open load at the second harmonic, wherein at least two of said first resonant circuits have different resonant frequencies.

4. The high frequency power amplifier according to claim 3, wherein each of said first resonant circuits includes an inductor and a capacitor connected in parallel.

5. The high frequency power amplifier according to claim 4, wherein the inductors of each of said first resonant circuits are bonding wires.

6. The high frequency power amplifier according to claim 4, wherein the inductors of each of said first resonant circuits are spiral inductors.

7. The high frequency power amplifier according to claim 4, wherein the inductors and the capacitors of each of said first resonant circuits are located on the same chip as said transistor.

8. The high frequency power amplifier according to claim 4, wherein the capacitors of each of said first resonant circuits and said transistor are located on separate chips.

9. The high frequency power amplifier according to claim 3, wherein each of said first resonant circuits includes:
an electrical-length controlling line; and
an open-end stub, a first end of which is connected to said electrical-length controlling line, and a second end of which is open.

10. The high frequency power amplifier according to claim 3, wherein each of said first resonant circuits includes:
an electrical-length controlling line; and
a short-circuited-end stub, a first end of which is connected to said electrical-length controlling line, and a second end of which is short-circuited.

11. The high frequency power amplifier according to claim 3, wherein the number of different resonant frequencies is an aliquot of the number of transistor cells.

12. The high frequency power amplifier according to claim 3, wherein the resonant frequencies of said first resonant circuits are divided into frequencies in the vicinity of the second harmonic of a lower limit of the operating frequency, and frequencies in the vicinity of the second harmonic of an upper limit of the operating frequency.

13. The high frequency power amplifier according to claim 3, wherein the resonant frequencies of said first resonant circuits are divided into frequencies in the vicinity of $(3f_1+f_2)/2$, and frequencies in the vicinity of $(f_1+3f_2)/2$, wherein $f_1$ and $f_2$ are lower limit and upper limits of the operating frequency of said transistor.

14. The high frequency power amplifier according to claim 3, wherein the resonant frequencies of said first resonant circuits are divided into frequencies in the vicinity of $2f_1$, frequencies in the vicinity of $f_1+f_2$, and frequencies in the vicinity of $2f_2$, wherein $f_1$ and $f_2$ are lower and upper limits of the operating frequency of said transistor.

15. The high frequency power amplifier according to claim 3, further comprising a plurality of second resonant circuits, each second resonant circuit being connected in series to a respective first resonant circuit, and having a resonant frequency different from the resonant frequency of said first resonant circuit.

16. The high frequency power amplifier according to claim 15, wherein said second resonant circuits resonate at a third or higher harmonic of the operating frequency of said transistor or within a predetermined frequency range having a center at the third or higher harmonic of the operating frequency, and becomes a high-impedance load at the third or higher harmonic, or an open load.

17. The high frequency power amplifier according to claim 4, wherein the capacitors of said first resonant circuits can be externally controlled.

* * * * *